United States Patent
Lin et al.

(10) Patent No.: US 8,186,221 B2
(45) Date of Patent: May 29, 2012

(54) VERTICALLY INTEGRATED MEMS ACCELERATION TRANSDUCER

(75) Inventors: Yizhen Lin, Gilbert, AZ (US); Todd F. Miller, Scottsdale, AZ (US); Woo Tae Park, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 542 days.

(21) Appl. No.: 12/409,920

(22) Filed: Mar. 24, 2009

(65) Prior Publication Data
US 2010/0242600 A1    Sep. 30, 2010

(51) Int. Cl.
*G01P 15/125*    (2006.01)
*G01P 3/04*    (2006.01)
*G01P 1/02*    (2006.01)

(52) U.S. Cl. ............ 73/514.32; 73/510; 73/493
(58) Field of Classification Search ........ 73/514.32, 73/493, 514.29, 514.16, 514.36, 514.38, 73/510, 511
See application file for complete search history.

(56) References Cited

U.S. PATENT DOCUMENTS

| | | | |
|---|---|---|---|
| 5,542,296 A | 8/1996 | Reidemeister et al. | |
| 5,576,483 A | 11/1996 | Bonin | |
| 6,845,670 B1 * | 1/2005 | McNeil et al. | 73/514.32 |
| 7,121,141 B2 * | 10/2006 | McNeil et al. | 73/514.32 |
| 7,239,022 B2 * | 7/2007 | Ikezawa et al. | 257/777 |
| 7,258,011 B2 * | 8/2007 | Nasiri et al. | 73/514.32 |
| 7,322,240 B2 * | 1/2008 | Robert | 73/514.32 |
| 7,335,971 B2 * | 2/2008 | Funk | 257/686 |
| 7,554,340 B2 * | 6/2009 | Furukubo et al. | 324/661 |
| 7,578,186 B2 * | 8/2009 | Matsuhisa | 73/504.12 |
| 7,793,544 B2 * | 9/2010 | Merassi et al. | 73/514.32 |
| 7,858,440 B2 * | 12/2010 | Pressel et al. | 438/109 |
| 2006/0179940 A1 | 8/2006 | Liu et al. | |
| 2008/0096301 A1 | 4/2008 | Ramamoorthi et al. | |
| 2008/0196499 A1 | 8/2008 | Li et al. | |
| 2010/0242603 A1 * | 9/2010 | Miller et al. | 73/514.32 |

FOREIGN PATENT DOCUMENTS
EP    0877255 A1    11/1998

OTHER PUBLICATIONS

PCT Application No. PCT/US2010/025579; Search Report and Written Opinion dated Sep. 27, 2010.

* cited by examiner

*Primary Examiner* — Helen C. Kwok
(74) *Attorney, Agent, or Firm* — Meschkow & Gresham, P.L.C.

(57) ABSTRACT

A transducer (20) includes sensors (28, 30) that are bonded to form a vertically integrated configuration. The sensor (28) includes a proof mass (32) movably coupled to and spaced apart from a surface (34) of a substrate (36). The sensor (30) includes a proof mass (58) movably coupled to and spaced apart from a surface (60) of a substrate (56). The substrates (36, 56) are coupled with the surface (60) of substrate (56) facing the surface (34) of substrate (36). Thus, the proof mass (58) faces the proof mass (32). The sensors (28, 30) are fabricated separately and can be formed utilizing differing micromachining techniques. The sensors (28, 30) are subsequently coupled (90) utilizing a wafer bonding technique to form the transducer (20). Embodiments of the transducer (20) may include sensing along one, two, or three orthogonal axes and may be adapted to detect movement at different acceleration sensing ranges.

15 Claims, 6 Drawing Sheets

FIG. 10

VERTICALLY INTEGRATED MEMS ACCELERATION TRANSDUCER

TECHNICAL FIELD OF THE INVENTION

The present invention relates generally to acceleration transducers. More specifically, the present invention relates to a vertically integrated microelectromechanical systems (MEMS) acceleration transducer.

BACKGROUND OF THE INVENTION

An acceleration transducer, or accelerometer, is a sensor typically utilized for measuring acceleration forces. These forces may be static, like the constant force of gravity, or they can be dynamic, caused by moving or vibrating the accelerometer. An accelerometer may sense acceleration or other phenomena along one, two, or three axes or directions. From this information, the movement or orientation of the device in which the accelerometer is installed can be ascertained. Accelerometers are used in inertial guidance systems, in airbag deployment systems in vehicles, in protection systems for a variety of devices, and many other scientific and engineering systems.

Capacitive-sensing MEMS accelerometer designs are highly desirable for operation in high gravity environments and in miniaturized devices, due to their relatively low cost. Capacitive accelerometers sense a change in electrical capacitance, with respect to acceleration, to vary the output of an energized circuit. One type of capacitive acceleration transducer is capable of detecting movement along one or two axes that are generally parallel to the plane of the transducer package. This type of acceleration transducer uses a movable element that moves substantially parallel to a surface of the substrate to which it is mounted under x-axis and/or y-axis acceleration. Another type of capacitive acceleration transducer has a "teeter-totter" or "see saw" movable element configuration that is capable of detecting movement along an axis that is generally perpendicular to the plane of the transducer package. This type of acceleration transducer uses a movable element or plate that rotates under z-axis acceleration perpendicular to a surface of a substrate. Both types of accelerometer structures can measure at least two distinct capacitances to determine differential or relative capacitance.

Prior art multiple axis acceleration transducers typically have monolithic designs. In a monolithic design, the sensing structures are fabricated on the same substrate, or device wafer, in a planar fashion. Although die size reduction may be achieved by more efficient die area design processes, more aggressive fabrication processes, and so forth, there is a limit to the effectiveness of these processes without increasing manufacturing cost or sacrificing part performance.

Accordingly, there is a need for an improved MEMS acceleration transducer and fabrication methodology for overcoming the problems in the art as discussed above.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

In accordance with the teachings herein, a compact acceleration transducer or accelerometer, is provided as an example for illustrative purposes. Embodiments of the acceleration transducer may include sensing along one, two, or three axes. Multiple axis sensing can be adapted to detect acceleration in two orthogonal axes that are parallel to a planar surface of the transducer, as well as to detect acceleration in an axis that is perpendicular to the planar surface of the transducer. In addition, the acceleration transducer may be adapted to detect acceleration at different acceleration sensing ranges, i.e., g levels. An embodiment of the invention further includes fabrication methodology for a vertically integrated, or stacked, acceleration transducer. Such an acceleration transducer is formed by separately fabricating two transducer wafers and subsequently bonding the two transducer wafers to create an acceleration transducer capable of sensing along the one, two, or three axes at the same or at different acceleration sensing ranges.

Figure 1:
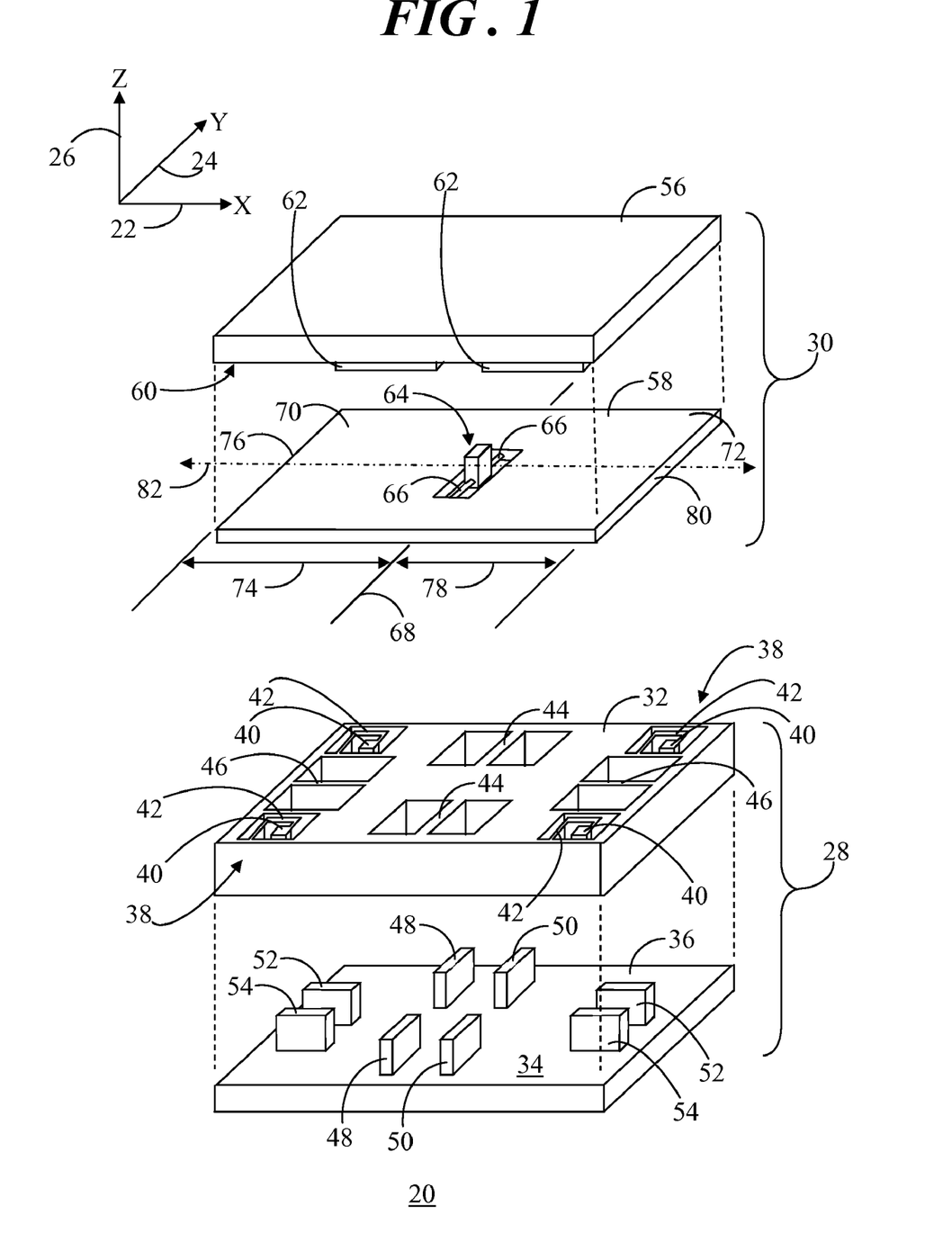
FIG. 1 shows an exploded perspective view of a microelectromechanical systems (MEMS) acceleration transducer in accordance with an embodiment of the invention.

FIG. 1 shows an exploded perspective view of a microelectromechanical systems (MEMS) acceleration transducer 20 in accordance with an embodiment of the invention. In the illustrated embodiment, transducer 20 is a multiple axis capacitive-sensing accelerometer adapted to sense acceleration in three mutually orthogonal directions. More specifically, transducer 20 senses acceleration in a direction 22 corresponding to an X axis, a direction 24 corresponding to a Y axis, and a direction 26 corresponding to a Z axis. For clarity, direction 22 is referred to hereinafter as X-direction 22, direction 24 is referred to as Y-direction 24, and direction 26 is referred to as Z-direction 26. Although transducer 20 is described herein as sensing acceleration in three mutually orthogonal directions, it should be understood that transducer 20 may be adapted to sense acceleration in only one direction or in two mutually orthogonal directions, as will be discussed in greater detail below. The layers of transducer 20 are shown as being separate for ease of view. However, it should be understood that the layers of transducer would actually be fitted together when implemented.

In an embodiment, transducer 20 includes a dual axis sensor 28 and a single axis sensor 30. Dual axis sensor 28 may be adapted to sense acceleration in X-direction 22 and Y-direction 24, and single axis sensor 30 may be adapted to sense acceleration in Z-direction 26. Sensors 28 and 30 are fabricated separately, then they are bonded together to create MEMS transducer 20 with sensor 30 located above sensor 28. This separate, or independent, fabrication strategy enables the utilization of different transducer manufacturing technologies for the two sensors 28 and 30 so as to achieve the most advantageous manufacturing solutions for particular transducer applications.

Dual axis sensor 28 includes a proof mass 32 spaced apart from, i.e., suspended above and positioned in spaced apart relationship above, a surface 34 of a substrate 36 via an anchor system 38. Anchor system 38 movably couples proof mass 32 to substrate 36. In an embodiment, anchor system 38 includes a number of anchors 40 formed on or coupled to surface 34 of substrate 36. Proof mass 32 is attached to anchors 40 by springs 42 that are preferably compliant in two mutually orthogonal directions, i.e., X-direction 22 and Y-direction 24. Thus, anchor system 38 enables proof mass 32 to move substantially parallel to surface 34 of substrate 36 in response to acceleration in either of X-and Y-directions 22 and 24, respectively.

Proof mass 32 of sensor 28 includes a first set of movable electrodes, referred to herein as movable fingers 44, and a second set of movable electrodes, referred to herein as movable fingers 46. Each movable finger 44 is surrounded by a pair of fixed electrodes, referred to herein as fixed fingers 48 and 50 that are formed on, or otherwise attached to, surface 34 of substrate 36. Fixed fingers 48 and 50 are in non-movable connection with substrate 36. That is, fixed fingers 48 and 50 do not move separate from substrate 36. Fingers 44, 48, and 50 are arranged perpendicular to X-direction 22 and form a differential capacitive structure for determining acceleration in X-direction 22. Likewise, each movable finger 46 is surrounded by a pair of fixed electrodes, referred to herein as fixed fingers 52 and 54 formed on, or otherwise attached to, surface 34 of substrate 36 so that they are in non-movable connection with substrate 36. Fingers 46, 52 and 54 are arranged perpendicular to Y-direction 24 and form a differential capacitive structure for determining acceleration in Y-direction 24.

When dual axis sensor 28 experiences acceleration in X-direction 22, proof mass 32 moves in X-direction 22 so that the distance between movable fingers 44 and the adjacent fixed fingers 48 and 50 changes, thus changing the capacitance between these fingers. This change in capacitance is registered by the sense circuitry (not shown) and converted to an output signal representative of the acceleration in X-direction 22. Acceleration in Y-direction 24 is sensed in an analogous manner by registering the change in capacitance between movable fingers 46 and the corresponding fixed fingers 52 and 54 when proof mass 32 moves in Y-direction 24. Accordingly, sensor 28 detects acceleration in orthogonal directions that are substantially parallel to surface 34 of substrate 36, namely X-direction 22 and Y-direction 24.

Various structures of sensor 28, such as proof mass 32, movable fingers 44 and 46, fixed fingers 48, 50, 52, and 54, springs 42, and anchors 40 are provided for illustrative purposes. It should be understood by those skilled in the art that these various elements can take different forms in accordance with particular design constraints. For example, proof mass 32 can have a different shape and there can be varying quantities and arrangements of movable fingers 44 and 46 and fixed fingers 48, 50, 52, and 54. In this exemplary embodiment, there are a total of four anchors 40 and four springs 42, with one spring 42 interconnecting each anchor 40 with proof mass 32. However, the quantity and location of anchors 40 and/or springs 42 can vary.

Single axis sensor 30 includes a substrate 56 and a proof mass 58 movably coupled to and spaced apart from a surface 60 of substrate 56. Substrate 56 has a number of conductive electrode elements 62 of a predetermined configuration deposited on surface 60 to form capacitor electrode elements or "plates." In an exemplary scenario, electrode elements 62 may operate as excitation or sensing electrodes to receive stimulating signals. Electrode elements 62 may additionally operate as a feedback electrodes when a feedback signal is superimposed on the sensing signal. In alternative embodiments, separate sensing and excitation electrodes may be formed on surface 60 of substrate 56 in accordance with known configurations.

Proof mass 58 is rotationally suspended from substrate 56 by an anchor system 64 formed on, or otherwise attached to surface 60 of substrate 56. For example, proof mass 58 is flexibly suspended above surface 60 of substrate 56 by rotational flexures 66 of anchor system 64 that enable proof mass 58 to pivot or rotate about a rotational axis 68. When intended for operation as a teeter-totter type accelerometer, a section 70 of proof mass 58 on one side of rotational axis 68 is formed with relatively greater mass than a section 72 of proof mass 58 on the other side of rotational axis 68. The greater mass of section 70 is typically created by offsetting rotational axis 68. That is, a length 74 between rotational axis 68 and an end 76 of section 70 is greater than a length 78 between rotational axis 68 and an end 80 of section 72. In addition, electrode elements 62 are sized and spaced symmetrically with respect to rotational axis 68 and a longitudinal axis 82 of proof mass 58.

In alternative embodiments, rotational axis 68 may be centered between ends 76 and 80 of proof mass 58. In such a configuration, the differing mass between section 70 and section 72 may be accomplished by making apertures through proof mass 58 in, for example, section 72 to decrease its mass relative to section 70. Alternatively, additional mass may be added to proof mass 58 on, for example, section 70 to increase its mass relative to section 72.

Due to the difference in mass between sections 70 and 72, proof mass 58 pivots about rotational axis 68 in response to acceleration in Z-direction 26, thus changing its position relative to the fixed electrode elements 62. This change in position results in a set of capacitors whose difference, i.e., a differential capacitance, is indicative of acceleration in Z-direction 26 perpendicular to surface 60 of substrate 56.

As will be discussed in greater detail below, substrate 56 is mechanically coupled to substrate 36 such that surface 60 faces surface 34, and proof mass 58 is situated facing proof mass 32. The mechanical coupling of substrate 56 with substrate 36 forms a chamber in which both proof mass 32 and proof mass 58 are located. In an embodiment, this mechanical coupling yields a chamber that is hermetically sealed. Thus, a multiple axis vertically integrated, or stacked, acceleration transducer is formed. The stacked configuration of transducer 20 formed from two sensors 28 and 30 can reduce transducer die size relative to prior art monolithic devices, yields a more attractive form factor, and can preclude the need for a separate cap wafer typically utilized to hermetically seal the components of a MEMS device.

MEMS sensor applications are calling for lower temperature coefficient of offset (TCO) specifications. The term "offset" refers to the output deviation from its nominal value at the non-excited state of the MEMS sensor. Thus, TCO is a measure of how much thermal stresses effect the performance of a semiconductor device, such as a MEMS device. The packaging of MEMS device applications often uses materials with dissimilar coefficients of thermal expansion. Thus, an undesirably high TCO can develop during manufacture or operation. These thermal stresses, as well as stresses due to moisture and assembly processes, can result in deformation of the underlying substrate, referred to herein as package stress, making the MEMS sensor more prone to measurement inaccuracies. Proof masses 32 and 58 are geometrically centered relative to one another. The geometrically centered arrangement of proof masses 32 and 58 of sensors 28 and 30 can reduce unwanted thermally induced offset, thereby resulting in better TCO performance.

Figure 2:
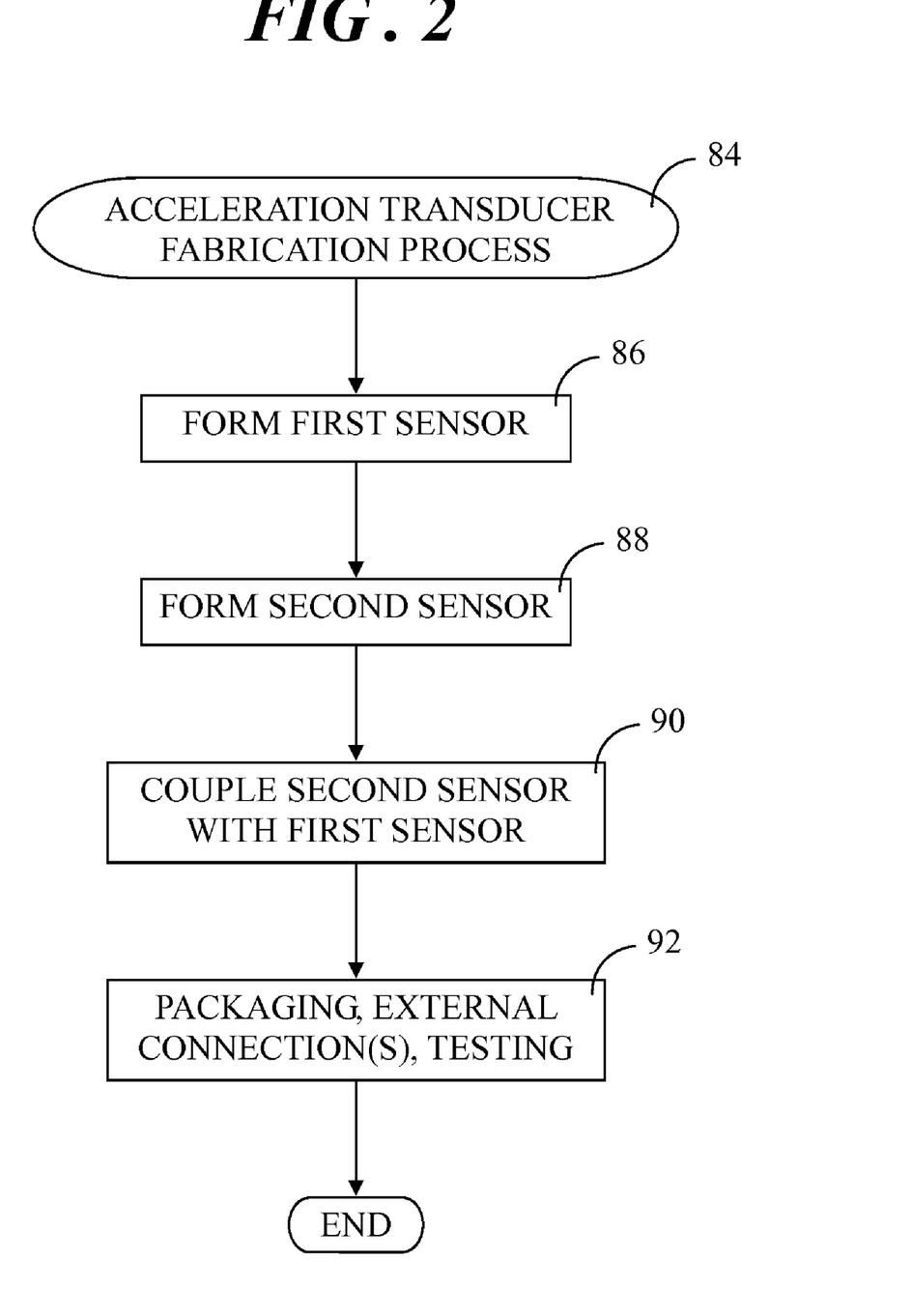
FIG. 2 shows a flowchart of a fabrication process for producing the acceleration transducer of FIG. 1 according to an exemplary embodiment.

FIG. 2 shows a flowchart of an acceleration transducer fabrication process 84 for producing acceleration transducer 20 according to an exemplary embodiment. Process 84 generally describes methodology for forming the separate sensors 28 and 30 and their subsequent bonding to form acceleration transducer 20. The separate formation of sensors 28 and 30 enables the utilization of different transducer manufacturing technologies for the two sensors 28 and 30 so as to achieve the most advantageous manufacturing solutions for particular transducer applications. In addition, MEMS devices typically require a cavity package with a lid. Fabrication process 84 describes a packaging technique in which sensor 30 is stacked with sensor 28 thereby eliminating the need for a separate cap wafer to hermetically seal the components of acceleration transducer 20. Fabrication process 84 is described below in connection with the fabrication of a single acceleration transducer 20. However, it should be understood by those skilled in the art that the following process allows for concurrent wafer-level manufacturing of a plurality of transducers 20. The individual transducers 20 can then be cut, or diced, in a conventional manner to provide individual acceleration transducers that are hermetically packaged.

Acceleration transducer fabrication process 84 includes a task 86 at which dual axis sensor 28 (FIG. 1) is formed. The formation of dual axis sensor 28 may include various patterning, deposition, and etching operations to form proof mass 32, anchor system 38, fixed fingers 48, 50, 52, 54, and the like. For example, the fabrication of movable parts, such as proof mass 32, can entail the implementation of release layers, also known as sacrificial layers. That is, a movable part can be built by depositing a sacrificial layer (not shown), which is selectively removed at the locations where the future beams, e.g., anchor system 38, will be attached to the underlying substrate. A structural layer is then deposited on top of the sacrificial layer and structured. The sacrificial layer is subsequently removed to release the movable parts, using a selective etch process that will not change the structural layer. In an embodiment, dual axis sensor 28 may be formed utilizing high aspect ratio micromachining processes to produce relatively tall microstructures with stiff, vertical sidewalls, i.e., a relatively thick proof mass 32. High aspect ratio micromachining processes can be utilized to form three-dimensional structures, having an aspect ratio greater than, for example, 5:1.

Acceleration transducer fabrication process 84 further includes a task 88 at which single axis sensor 30 is formed. The formation of single axis sensor 30 may include various patterning, deposition, and etching operations of sacrificial and structural layers to form proof mass 58 suspended above and positioned in spaced apart relationship above surface 60 of substrate 56, and to form electrode elements 62 and anchor system 64. In an embodiment, single axis sensor 30 may be formed utilizing surface micromachining processes. Surface micromachining enables patterning of thin films of polysilicon and other materials to form essentially two-dimensional planar structures, since the thickness of the structures is limited by the thickness of the deposited films.

It should be noted that task 86 pertains to the fabrication of dual axis sensor 28 and task 88 pertains to the fabrication of single axis sensor 30. Accordingly, although they are described herein as being serial operations for simplicity, these distinct operations may be performed in parallel in separate areas of a single manufacturing facility or these distinct operations may be performed at different manufacturing facilities.

It should be further noted that acceleration transducer fabrication process 84 is described in connection with formation of dual axis sensor 28 and single axis sensor 30 in an embodiment. However, in alternative embodiments, sensors 28 and 30 may be any combination of single or dual axis sensors in accordance with particular design requirements. For example, sensor 28 may be adapted to sense in one of X-direction 22, Y-direction 24, or Z-direction 26. Similarly, sensor 30 may be adapted to sense in one of X-direction 22, Y-direction 24, or Z-direction. Accordingly, acceleration transducer 20 may sense acceleration in only X-direction 22, Y-direction 24, or Z-direction 26 or any combination of X-, Y-, and Z-directions, 22, 24, 26.

The independent fabrication methodology of sensors 28 and 30 further enables the formation of sensors 28 and 30 that detect acceleration in different sensing ranges within a single acceleration transducer package in accordance with particular design requirements. For example, sensor 28 may be utilized to detect acceleration in a medium-g sensing range of, for example, ten to one hundred g's. Sensor 30 may detect acceleration in the same sensing direction or directions as sensor 28 but may be utilized to detect acceleration in a different sensing range, for example, a high-g sensing range of greater than one hundred g's or a low-g sensing range of less than ten g's. Accordingly, sensor formation tasks 86 and 88 utilizing the same or differing fabrication processes enable configuration of an optimal transducer design for a desired application.

Following tasks 86 and 88, acceleration transducer fabrication process 84 continues with a task 90. At task 90, sensor 30 is mechanically coupled with sensor 28 using conventional wafer bonding processes to form acceleration transducer 20. Coupling of sensors 28 and 30 may be achieved through application of bonding layers on bonding perimeters of each of corresponding substrates 36 and 56. Such bonding layers may be metallic bond rings that couple to one another to form a hermetically sealed joint surrounding proof masses 32 and 58. The bonding layers can be a number of different materials typically used for creating the hermetically sealed joint. Such materials include, for example, aluminum, copper, silver, gold, indium, alloys thereof, compounds thereof, glass frit, and the like. It should be understood, however, that if a hermetic seal is not desired, the bonding layers may alternatively be formed from filled epoxies or filled silicones.

A task 92 may be performed subsequent to coupling task 90. At task 92, acceleration transducer 20 may undergo further operations in accordance with conventional processes, such as wafer thinning, packaging, wirebonding to form external connections, testing and so forth. Following task 92, acceleration transducer fabrication process 84 ends and acceleration transducer 20 may be utilized for acceleration measurement.

Figure 3:
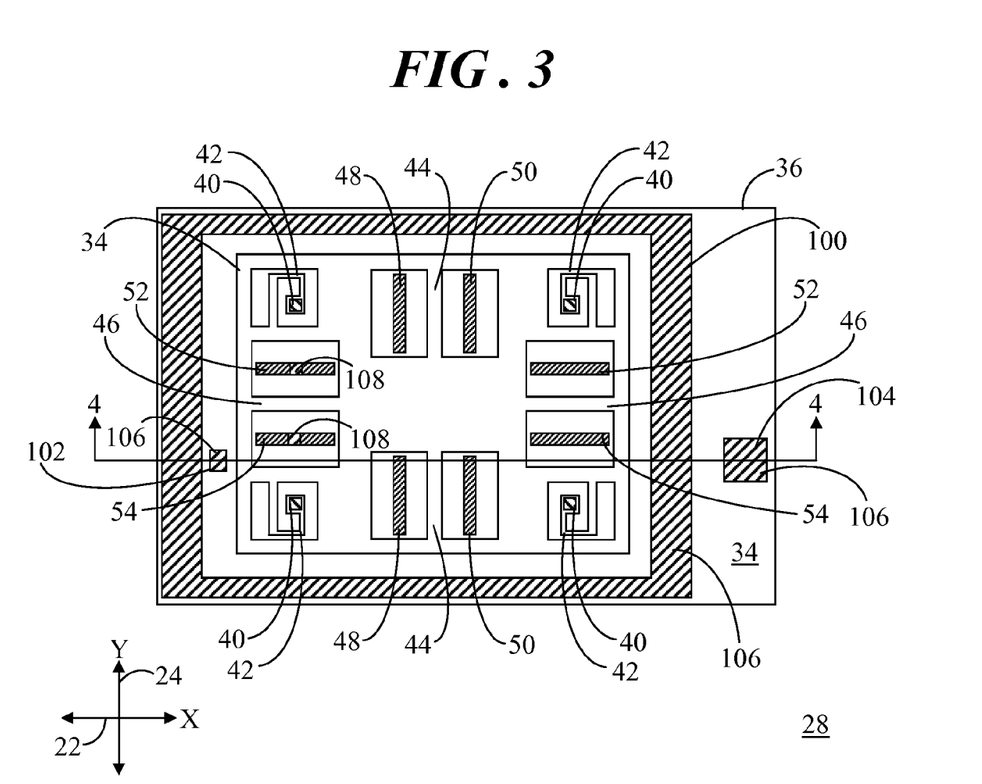
FIG. 3 shows a top view of a dual axis sensor of the acceleration transducer of FIG. 1.
Figure 4:
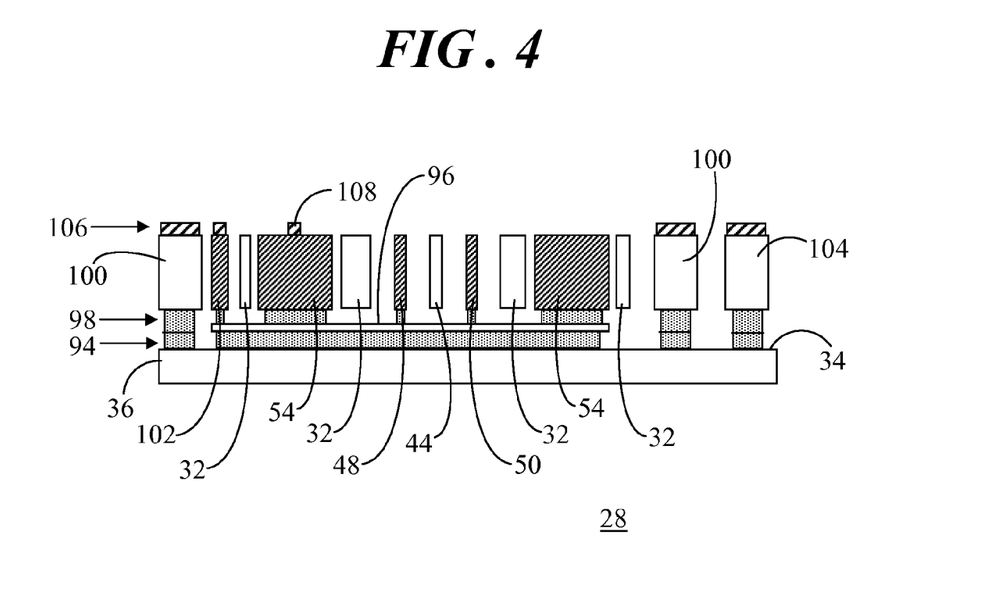
FIG. 4 shows a side view of the dual axis sensor along section lines 4-4 of FIG. 3.

Referring now to FIGS. 3-4, FIG. 3 shows a top view of dual axis sensor 28 of acceleration transducer 20 (FIG. 1), and FIG. 4 shows a side view of dual axis sensor 28 along section lines 4-4 of FIG. 3. Dual axis sensor 28 was formed through the execution of task 86 (FIG. 2) of acceleration transducer fabrication process 84 (FIG. 2) using, for example, known and developing high aspect ratio micromachining processes.

In an embodiment, sensor 28 includes an isolation layer 94 overlying surface 34 of substrate 36. Patterning, etching, and/or deposition processes may then be performed to form an electrically conductive layer 96 overlying isolation layer 94, and another isolation layer 98 may be formed over conductive layer 96. Electrically conductive layer 96 may be formed and patterned to provide the appropriate electrical connections between fixed fingers 48, 50, 52, and 54 as needed. Proof mass 32, fixed finger 48, 50, 52, and 54, anchors 40, and springs 42 are subsequently formed over isolation layer 98. Selective sacrificial layer deposition and etching results in the release of proof mass 32 from surface 34 of substrate 36 to enable its movement substantially parallel to surface 34 in response to acceleration sensed in X-direction 22 and/or Y-direction 24.

Sensor 28 may further include a seal ring 100, one or more internal connection sites 102 (of which only one is shown for simplicity), and one or more external connection sites 104 (of which only one is shown for simplicity) that are formed concurrently with other components of sensor 28. Seal ring 100 encircles proof mass 32 and defines the location at which sensor 28 will be coupled with sensor 30 (FIG. 1). Internal connection sites 102 are implemented to form electrical connections between sensor 28 and sensor 30, as needed. External connection sites 104 are implemented to form electrical connections between sensor 28 and sensor 30 and/or between sensor 28 and external circuitry (not shown), as needed.

Prior to removal of an underlying sacrificial layer (not shown) and release of proof mass 32, a top layer 106 may be deposited over the underlying structures. Top layer 106 may be patterned and etched so that top layer 106 remains on seal ring 100 to serve as a bonding medium for creating a hermetically sealed joint between sensor 28 and sensor 30 (FIG. 1). In an embodiment, top layer 106 may be an electrically conductive material such as aluminum, copper, silver, gold, indium, alloys thereof, and compounds thereof. Thus, top layer 106 may also be appropriately patterned and etched so that it remains on internal connection sites 102 and external connection sites 104 in order to form subsequent electrical connections, discussed below.

In accordance with an embodiment of the invention, top layer 106 may additionally be appropriately patterned and etched so that it remains on at least a portion of the underlying fixed structure of sensor 28 to form one or more over-travel stops 108 (of which two are shown for simplicity). As illustrated, over-travel stops 108 are formed on and extend above one pair of fixed fingers 52 and 54. Thus, over-travel stops 108 are in non-movable connection with surface 34 of substrate 36 via fixed fingers 52 and 54. Once sensors 28 and 30 are coupled, over-travel stops 108 function to limit movement of proof mass 58 (FIG. 1) so that proof mass 58 cannot come into contact with proof mass 32 when sensor 30 is subjected to harsh acceleration in Z-direction 26 (FIG. 1).

Figure 5:
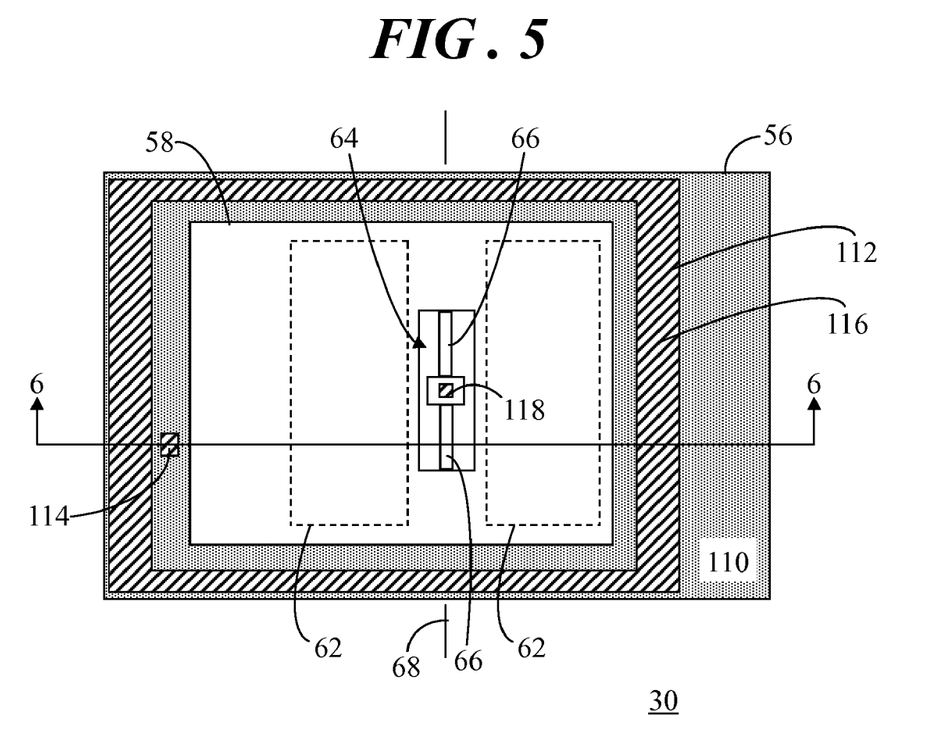
FIG. 5 shows a top view of a single axis sensor of the acceleration transducer of FIG. 1.
Figure 6:
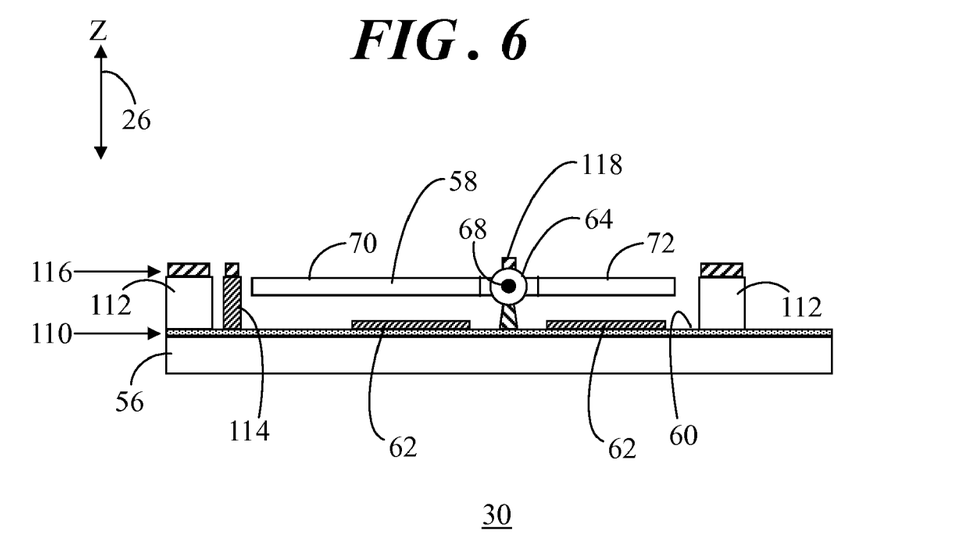
FIG. 6 shows a side view of the single axis sensor along section lines 6-6 of FIG. 5.

Referring now to FIGS. 5-6, FIG. 5 shows a top view of single axis sensor 30 of acceleration transducer 20 (FIG. 1), and FIG. 6 shows a side view of single axis sensor 30 along section lines 6-6 of FIG. 4. Single axis sensor 30 was formed through the execution of task 88 (FIG. 2) of acceleration transducer fabrication process 84 (FIG. 2) using, for example, known and developing surface micromachining processes.

In an embodiment, sensor 30 includes an isolation layer 110 overlying surface 60 of substrate 56. Patterning, etching, and/or deposition processes may then be performed to form electrode elements 62 overlying isolation layer 110. Proof mass 58 and anchor system 64 are subsequently formed over isolation layer 110. Selective sacrificial layer deposition and etching results in the release of proof mass 58 from surface 60 of substrate 56 to enable its pivotal movement about rotational axis 68 in response to acceleration sensed in Z-direction 26.

Sensor 30 may further include a seal ring 112 and, if needed, one or more internal connection sites 114 (of which only one is shown for simplicity), and, if needed, one or more external connection sites (not shown) that are formed concurrently with other components of sensor 30. Seal ring 112 encircles proof mass 58 and defines the location at which sensor 30 will be coupled with sensor 28 (FIG. 3). Internal connection sites 114 may be implemented to form electrical connections between sensor 28 and sensor 30, as needed. The external connection sites, if present, may be implemented to form electrical connections between sensor 28 and sensor 30 and/or between sensor 30 and external circuitry (not shown), as needed.

Prior to removal of an underlying sacrificial layer (not shown) and release of proof mass 58, a top layer 116 may be deposited over the underlying structures. Top layer 116 may be patterned and etched so that top layer 116 remains on seal ring 112 to serve as a bonding medium for creating a hermetically sealed joint between sensor 28 (FIG. 3) and sensor 30. Like top layer 106 (FIG. 3), top layer 116 may be an electrically conductive material such as aluminum, copper, silver, gold, indium, alloys thereof, and compounds thereof. Thus, top layer 116 may also be appropriately patterned and etched so that it remains on internal connection sites 114 and the external connection sites (if present) in order to form subsequent electrical connections, discussed below.

In accordance with an embodiment of the invention, top layer 116 may additionally be appropriately patterned and etched so that it remains on at least a portion of the underlying fixed structure of sensor 30 to form one or more over-travel stops 118 (of which only one is shown for simplicity). As illustrated, over-travel stop 118 is formed on and extends above a fixed portion of anchor system 64. Thus, over-travel stop 118 is in non-movable connection with surface 60 of substrate 56 via anchor system 64. Once sensors 28 and 30 are coupled, over-travel stop 118 functions to limit movement of proof mass 32 (FIG. 3) so that proof mass 32 cannot come into contact with proof mass 58 when sensor 28 is subjected to harsh acceleration in Z-direction 26. That is, proof mass 32 is designed to move in X-direction 22 (FIG. 1) and/or Y-direction 24 (FIG. 1) when subjected to acceleration in either of those directions. However, the compliance of anchor system 38 (FIG. 1) may enable proof mass 32 to experience some movement in Z-direction 26 under excessive accelerations. Accordingly, over-travel stop 118 limits this undesired movement.

Figure 7:
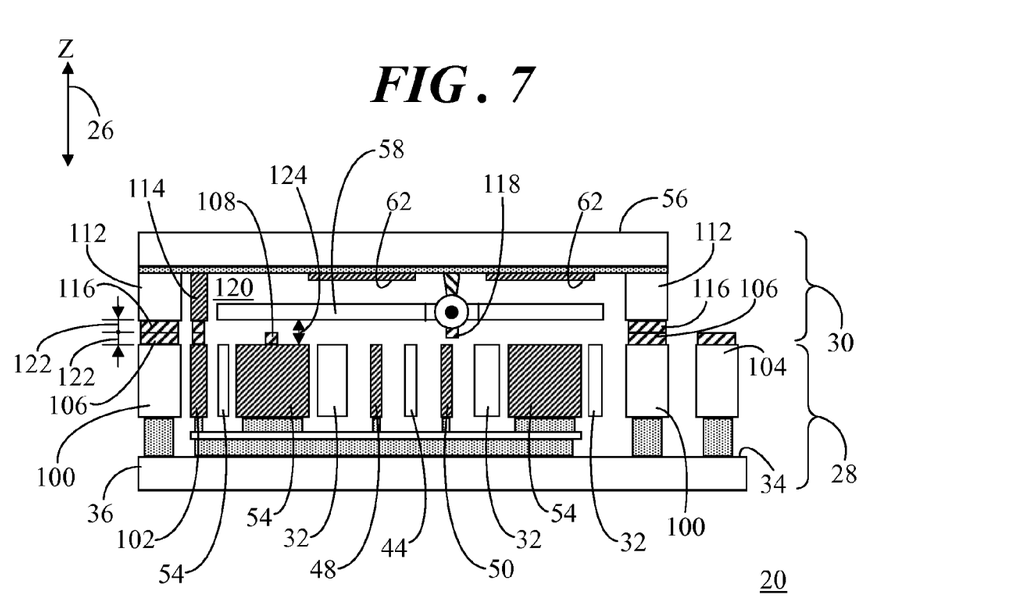
FIG. 7 shows a side view of the dual axis sensor coupled with the single axis sensor of to form the acceleration transducer of FIG. 1.

FIG. 7 shows a side view of dual axis sensor 28 coupled with the single axis sensor 30 to form acceleration transducer 20. Top layer 116 on seal ring 112 of sensor 30 is bonded with top layer 106 on seal ring 100 of sensor 28 to form an interior volume, or chamber 120, in which the functional components of each of sensors 28 and 30 are located. In addition, a portion of substrate 56 was sawn to reveal external connection sites 104.

In an embodiment, top layers 106 and 116 may be formed from aluminum and bonding may occur using a thermocompression bonding technique, although this bonding technique is not a limitation. Thermocompression bonding involves heating sensors 28 and/or 30 to approximately four hundred and fifty degrees Celsius and then pressing top layer 116 on seal ring 112 of sensor 30 to the corresponding top layer 106 on seal ring 100 of sensor 28 with a predetermined pressure (e.g., from 200 to 400 lb/sq inch). A hermetically sealed bond with excellent physical and electrical properties is subsequently formed. Per convention, an additional operation of oxide break-down by, for example, an ultrasonic scrub, wet etch, or plasma clean may be required prior to bonding.

The height of each of seal rings 100 and 112 is commensurate with the height of the structural components of their corresponding sensors 28 and 30. Accordingly, an appropriate thickness 122 of each of top layers 106 and 116 produces a clearance, or gap 124, between proof mass 58 of sensor 30 and proof mass 32 and fixed fingers 48, 50, 52, and 54 of sensor 28. Gap 124 is configured to be wide enough to minimize cross-talk capacitance between sensor 30 and sensor 28. In an exemplary configuration, thickness 122 of each of top layers 106 and 116 may be approximately four micrometers to yield a width of gap 124 of approximately eight micrometers in order to minimize cross-talk capacitance. Implementation of an aluminum-to-aluminum thermocompression bonding technique provides for excellent accuracy in controlling the width of gap 124.

Over-travel stops 108 and 118 are located within chamber 120 between proof mass 32 and proof mass 58. Over-travel stops 108 limit the movement of proof mass 58 in Z-direction 26. Likewise, over-travel stop 118 limits movement of proof mass 32 in Z-direction 26. Thus, since thickness 122 of each top layers 106 and 116 is approximately four micrometers in the exemplary configuration, and corresponding over-travel stops 108 and 118 are formed in conjunction with top layers 106 and 116, over-travel stops 108 and 118 are also approximately four micrometers thick. As such, over-travel stops 108 and 118 limit movement in Z-direction 26 to four micrometers of maximum travel.

Figure 8:
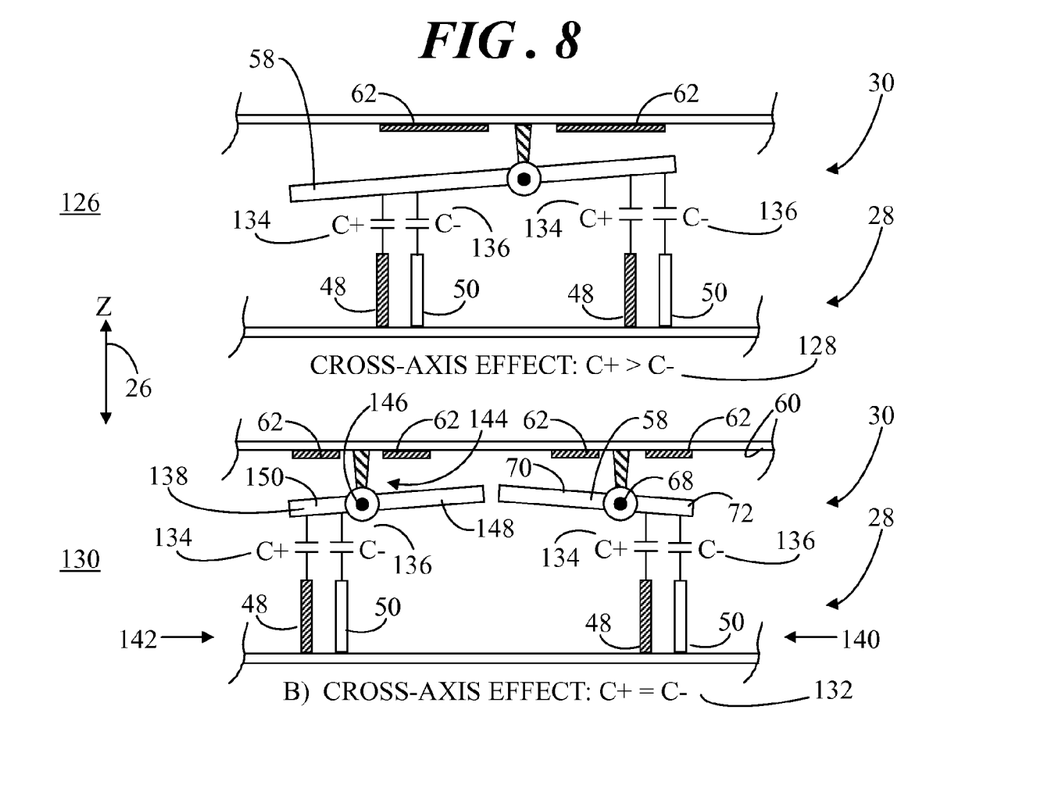
FIG. 8 shows a first illustration demonstrating a cross-talk capacitance effect and a second illustration demonstrating cross-talk capacitance cancellation in accordance with an embodiment of the invention.

FIG. 8 shows a first illustration 126 demonstrating a cross-talk capacitance effect 128 and a second illustration 130 demonstrating cross-talk capacitance cancellation 132 in accordance with an embodiment of the invention. As discussed previously, the movement of a proof mass toward sense electrodes changes a capacitance between the proof mass and the sense electrodes. More particularly, the capacitance increases as the proof mass moves closer to the sense electrodes. As shown in illustration 126, in a scenario in which sensor 28 includes multiple fixed fingers 48 and 50, a first capacitance 134, labeled C+, between fixed fingers 48 and proof mass 58 of sensor 30 may be greater than a second capacitance 136, labeled C−, between fixed fingers 50 and proof mass 58 of sensor 30. The capacitance imbalance between capacitance 134, labeled C+, and capacitance 136, labeled C−, represents cross-talk capacitance effect 128. This can cause measurement inaccuracies in sensor 28.

In order to reduce the measurement inaccuracies in sensor 28 caused by cross-talk capacitance effect 128, in an alternative embodiment, sensor 30 may include an additional proof mass 138. This configuration is shown in second illustration 130. By way of example, proof mass 58 is in opposing relationship with a portion 140, or subset, of fixed fingers 48 and 50. Proof mass 138 is spaced apart from surface 60 of substrate 56, and is in opposing relationship with another portion 142, or subset, of fixed fingers 48 and 50. An anchor system 144 is formed on surface 60 of substrate 56 and is pivotally coupled with proof mass 138 at another rotational axis 146. Anchor system 144 enables proof mass 138 to rotate about rotational axis 146 in response to acceleration in Z-direction 26.

It should be noted that rotational axis 146 is offset from a midline of proof mass 138. This results in a section 148 of proof mass 138 being formed with a relatively greater mass than a section 150 of proof mass 138. Moreover, the offset of rotational axis 146 is generally equal to and in a direction opposite that of the offset of rotational axis 68 from a midline of proof mass 58. Accordingly, the mass of section 148 of proof mass 138 is substantially equal to the mass of section 70 of proof mass 58. Likewise the mass of section 150 of proof mass 138 is substantially equal to the mass of section 72 of proof mass 58. Accordingly, acceleration in Z-direction 26 will cause proof masses 58 and 138 to pivot about their corresponding axes 68 and 146 in equal but opposite directions.

In this configuration, the summation of first capacitances 134, labeled C+, between fixed fingers 48 and proof masses 58 and 138 is approximately equal to the summation of second capacitances 136, labeled C−, between fixed fingers 50 and proof masses 58 and 138. Accordingly, in the configuration of second illustration 130, the cross-talk capacitance is balanced, i.e., C+=C−, thus yielding cross-talk capacitance cancellation 132.

Figure 9:
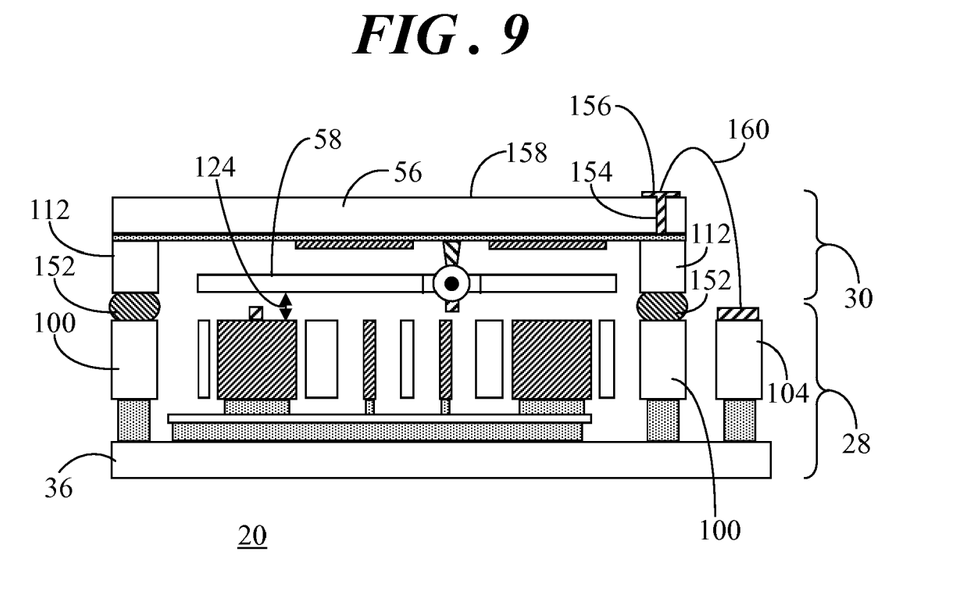
FIG. 9 shows a side view of the transducer of FIG. 1 in accordance with an alternative embodiment.

FIG. 9 shows a side view of transducer 20 following packaging in accordance with an alternative embodiment. Although, aluminum-to-aluminum thermocompression bonding (discussed above) is a preferred bonding technique due to its excellent accuracy in control of the width of gap 124, other bonding techniques may be employed. Other bonding techniques include, but are not limited to, eutectic bonding, silicon fusion bonding, glass frit bonding, and so forth. In this exemplary illustration, a bond 152 is formed between seal rings 100 and 112 of sensors 28 and 30 using a glass frit bonding technique. Glass frit bonding enables the bonding of surface materials commonly used in MEMS technology and can be used for wafer level encapsulation and packaging. It allows for hermetic sealing and a high process yield.

In this embodiment, for non-conductive glass frit bonding, electrical connection between sensor 28 and sensor 30 can be achieved by wirebonding. For example, transducer 20 further includes at least one through-silicon via 154 extending through substrate 56 of sensor 30 and having a contact 156 on an outer surface 158 of substrate 56. A wirebond 160 is formed between contact 156 and external connection site 104.

Figure 10:
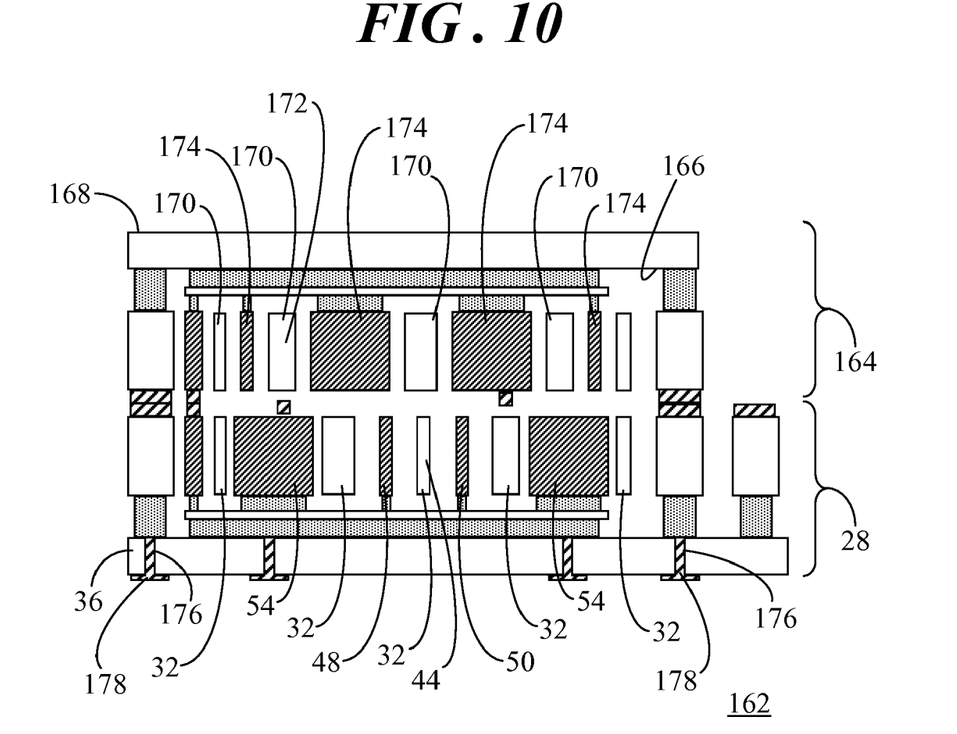
FIG. 10 shows a side view of a MEMS acceleration transducer in accordance with another alternative embodiment.

FIG. 10 shows a side view of a MEMS acceleration transducer 162 in accordance with another alternative embodiment. As mentioned previously, embodiments of the acceleration transducer may include sensing along one, two, or three axes. Multiple axis sensing can be adapted to detect movement in two orthogonal axes that are parallel to a planar surface of the transducer. In addition, the acceleration transducer may be adapted to detect movement at different acceleration sensing ranges, i.e., g levels.

In the illustrated embodiment, transducer 162 is a multiple axis capacitive-sensing accelerometer adapted to sense acceleration in two mutually orthogonal directions and at different acceleration sensing ranges. Transducer 162 includes sensor 28 and another sensor 164 coupled with sensor 28 in accordance with methodology described above. In this embodiment, sensor 28 senses acceleration in X-direction 22 (FIG. 1) and Y-direction 24 (FIG. 1). Likewise, sensor 164 senses acceleration in X-direction 22 (FIG. 1) and Y-direction 24 (FIG. 1).

Sensor 164 can include structures similar to those discussed in connection with sensor 28. For example, sensor 164 includes an anchor system, such as anchor system 38 (shown in FIG. 1) formed on a surface 166 of a substrate 168. The anchor system (e.g., anchor system 38) is coupled with a proof mass 170 having movable fingers, collectively referred to as movable fingers 172. Fixed fingers, collectively referred to as fixed fingers 174, are in non-movable connection with surface 166 of substrate 169, and each of movable fingers 172 is disposed between a pair of fixed fingers 174 to form a differential capacitive structure. Accordingly, the anchor system (e.g., anchor system 38) enables proof mass 170 to move substantially parallel to surface 166 of substrate 168 in response to acceleration in X-direction 22 (FIG. 1) and/or Y-direction 24 (FIG. 1).

The configuration of sensor 164 is similar to that of sensor 28 and sensor 164 detects acceleration in the same sense directions, i.e. X-direction 22 and Y-direction 24 as that of sensor 28. However, sensor 164 is adapted to detect acceleration over a different sensing range than the sensing range for sensor 28. By way of example, sensor 28 may be a low-g acceleration sensor suitable for detection of acceleration in X-direction 22 and Y-direction 24 at low-g levels of, for example less than ten g's. Sensor 164 may be a medium-g acceleration sensor suitable for detection of acceleration at medium-g levels of, for example, between ten and one hundred g's. Thus, sensor 28 senses acceleration over a first sensing range (low-g) that differs from the second sensing range (medium-g) of sensor 164. Different sensing ranges may be achieved through the implementation of anchor systems with different spring compliance so that corresponding proof masses 32 and 170 move appropriately when subjected to particular g's. Those skilled in the art will recognize, however, that other structural features may be implemented in sensors 28 and 164 to achieve the desired sensing range.

Although low-g and medium-g accelerometers are mentioned herein, it should be further understood that in other embodiments a transducer package may include any combination of low-g, medium-g, and high-g accelerometers specified for a particular application. Moreover, although particular sensing ranges are mentioned herein, it should be understood that a variety of sensing ranges may be established. In addition, although acceleration sensing over different sensing ranges is discussed in connection with sensing in X-direction 22 and/or Y-direction 24, in alternative embodiments, a transducer may include two sensors, each of which sense acceleration in Z-direction 26 (FIG. 1) and each sensing over different sensing ranges.

In an embodiment, transducer 162 further includes through-silicon vias 176 to create a chip-scale package configuration for transducer 162. A chip-scale package is a type of surface mount integrated circuit packaging in which the total package size is typically no more than twenty percent greater than the size of the die within. A through-silicon via is a vertical electrical connection passing completely through a silicon wafer or die. In this configuration, chip-scale package transducer 162 includes a number of through-silicon vias 176 electrically coupled with external contacts 178 that can be used to create space saving vertically configured surface mount electrical connections. Those skilled in the art will recognize that electrical connection is not limited to those techniques discussed herein but may alternatively implement current and developing technologies including, but not limited to, pins or leads of various styles, flat contacts, a matrix of solder balls (ball grid arrays), terminations on the body of the component, and so forth.

An embodiment described herein comprises a compact MEMS acceleration transducer that includes two sensors in a vertically integrated, or stacked, configuration. Embodiments of the acceleration transducer may include sensing along one, two, or three mutually orthogonal axes. Multiple axis sensing can be adapted to detect movement in two orthogonal axes that are parallel to a planar surface of the transducer, as well as to detect movement in an axis that is perpendicular to the planar surface of the transducer. In addition, the acceleration transducer may be adapted to detect movement at different acceleration sensing ranges, for example, low-g, medium-g, high-g, or any combination thereof. Another embodiment of the invention further includes fabrication methodology for a vertically integrated, or stacked, acceleration transducer. Such an acceleration transducer is formed by separately fabricating two sensors and subsequently bonding the two sensors to create an acceleration transducer capable of sensing along the one, two, or three axes at the same or at different acceleration sensing ranges.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A transducer adapted to sense acceleration comprising:
   a first substrate having a first surface;
   a first proof mass movably coupled to said first surface and spaced apart from said first surface of said first substrate;
   a second substrate having a second surface, said second substrate being coupled to said first substrate to form a hermetically sealed chamber with said second surface facing said first surface; and
   a second proof mass movably coupled to said second surface and spaced apart from said second surface of said second substrate, said first proof mass and said second proof mass being located in said hermetically sealed chamber, and said second proof mass being situated facing said first proof mass.

2. A transducer as claimed in claim 1 further comprising an anchor system formed on said first surface of said first substrate and coupled with said first proof mass, said anchor system enabling said first proof mass to move substantially parallel to said first surface of said first substrate in response to said acceleration in a first direction.

3. A transducer as claimed in claim 2 further comprising:
   movable fingers formed in said first proof mass and arranged perpendicular to said first direction; and
   fixed sense fingers in non-movable connection with said first substrate and arranged substantially parallel to said movable fingers, each of said movable fingers being disposed between a pair of said fixed sense fingers to form a differential capacitive structure.

4. A transducer as claimed in claim 2 wherein said anchor system further enables said first proof mass to move substantially parallel to said first surface of said first substrate in response to said acceleration in a second direction, said second direction being orthogonal to said first direction.

5. A transducer as claimed in claim 2 wherein said anchor system is a first anchor system, and said transducer further comprises a second anchor system formed on said second surface of said second substrate and coupled with said second proof mass to enable said second proof mass to move substantially parallel to said second surface of said second substrate in response to said acceleration in said first direction.

6. A transducer as claimed in claim 5 further comprising:
   a first sensor adapted to detect said acceleration in said first direction over a first sensing range, said first proof mass forming a portion of said first sensor; and
   a second sensor adapted to detect said acceleration in said first direction over a second sensing range, said second proof mass forming a portion of said second sensor, and said second sensing range differing from said first sensing range.

7. A transducer as claimed in claim 1 wherein said second proof mass is adapted for motion relative to a rotational axis, and said transducer further comprises an anchor system formed on said second surface of said second substrate and pivotally coupled with said second proof mass, said anchor system enabling said second proof mass to rotate about said rotational axis in response to said acceleration in a direction perpendicular to said second surface of said second substrate.

8. A transducer as claimed in claim 7 wherein:
said second proof mass comprises first and second ends, a first section is formed between said rotational axis and said first end, a second section is formed between said rotational axis and said second end, said first section exhibiting a greater mass than said second section; and
said transducer further comprises first and second electrode elements formed on said second surface of said second substrate, said first electrode element facing said first section, said second electrode element facing said second section, and each of said first and second electrode elements being adapted to sense said acceleration in said direction perpendicular to said second surface.

9. A transducer as claimed in claim 7 wherein said anchor system is a first anchor system, and said transducer further comprises:
fixed sense fingers formed on said first surface of said first substrate, said second proof mass being situated facing a first portion of said fixed sense fingers;
a third proof mass movably coupled to said second surface and spaced apart from said second surface of said second substrate, said third proof mass being situated facing a second portion of said fixed sense fingers; and
a second anchor system formed on said second surface of said second substrate and pivotally coupled with said third proof mass at a second rotational axis, said second anchor system enabling said third proof mass to rotate about said second rotational axis in response to said acceleration in said direction perpendicular to said second surface.

10. A transducer as claimed in claim 1 further comprising an over-travel stop positioned between said first proof mass and said second proof mass, said over-travel stop being in non-movable connection with one of said first and second surfaces, said over-travel stop being adapted to limit movement of at least one of said first and second proof masses in a direction perpendicular to said first and second surfaces of said first and second substrates.

11. A transducer as claimed in claim 10 wherein said over-travel stop is a first over-travel stop in non-movable connection with said first surface and adapted to limit movement of said second proof mass in said direction, and said transducer further comprises a second over-travel stop positioned between said first proof mass and said second proof mass, said second over-travel stop being in non-movable connection with said second surface and adapted to limit movement of said first proof mass in said direction.

12. A transducer as claimed in claim 1 wherein said second proof mass is in opposing relationship with fixed sense fingers formed on said first surface of said first substrate, said second proof mass being spaced apart from said fixed sense fingers by a gap having a width sufficient to limit crosstalk capacitance between said second proof mass and said fixed sense fingers.

13. A method of producing a microelectromechanical systems (MEMS) transducer adapted to sense acceleration comprising:
forming a first sensor adapted to detect said acceleration, said first sensor including a first substrate having a first surface, a first proof mass movably coupled to said first surface and positioned in spaced apart relationship above said first surface, and first fixed electrodes formed on said first surface;
forming a second sensor adapted to detect said acceleration, said second sensor including a second substrate having a second surface, a second proof mass movably coupled to said second surface and positioned in spaced apart relationship above said first surface, and second fixed electrodes formed on said second surface; and
after forming said first and second sensors, coupling said second substrate to said first substrate to form a hermetically sealed chamber such that said second surface faces said first surface, said first proof mass and said second proof mass being located in said hermetically sealed chamber, and said second proof mass is situated facing said first proof mass.

14. A method as claimed in claim 13 wherein:
said forming said first sensor includes forming a first anchor system on said first surface of said first substrate, said first anchor system being coupled with said first proof mass, said first anchor system enabling said first proof mass to move substantially parallel to said first surface of said first substrate in response to said acceleration in a first direction; and
said forming said second sensor include forming a second anchor system of said second surface of said second substrate, said second anchor system being pivotally coupled with said second proof mass at a rotational axis to enable said second proof mass to rotate about said rotational axis in response to said acceleration in a second direction, said second direction being perpendicular to said second surface of said second substrate.

15. A method as claimed in claim 13 wherein:
said forming said first sensor includes forming a first anchor system on said first surface of said first substrate, said first anchor system being coupled with said first proof mass, said first anchor system enabling said first proof mass to move substantially parallel to said first surface of said first substrate in response to said acceleration in a first direction, wherein said first sensor is adapted to detect said acceleration in said first direction over a first sensing range; and
said forming said second sensor includes forming a second anchor system on said second surface of said second substrate, said second anchor system being coupled with said second proof mass, said second anchor system enabling said second proof mass to move substantially parallel to said second surface of said second substrate in response to said acceleration in said first direction, wherein said second sensor is adapted to detect said acceleration in said first direction over a second sensing range that differs from said first sensing range.

* * * * *